(12) United States Patent
Swanson et al.

(10) Patent No.: US 7,498,654 B2
(45) Date of Patent: Mar. 3, 2009

(54) TRANSISTOR APPARATUS

(75) Inventors: Leland Scott Swanson, McKinney, TX (US); Gregory E. Howard, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 66 days.

(21) Appl. No.: 11/408,775

(22) Filed: Apr. 21, 2006

(65) Prior Publication Data
US 2007/0246800 A1    Oct. 25, 2007

(51) Int. Cl.
*H01L 29/00* (2006.01)
*H01L 27/01* (2006.01)
(52) U.S. Cl. .......................... 257/517; 257/347; 257/565
(58) Field of Classification Search .................. 357/347, 357/348, 350, 517, 565, 575, E21.32, E21.379, 357/E21.564, E29.034
See application file for complete search history.

(56) References Cited
U.S. PATENT DOCUMENTS

| | | | | |
|---|---|---|---|---|
| 5,723,896 | A | * | 3/1998 | Yee et al. .................... 257/499 |
| 5,994,740 | A | * | 11/1999 | Nakagawa et al. ........... 257/350 |
| 6,114,730 | A | * | 9/2000 | Tani ............................ 257/353 |

* cited by examiner

*Primary Examiner*—Hung Vu
(74) *Attorney, Agent, or Firm*—Jacqueline J. Garner; W. James Brady, III; Frederick J. Telecky, Jr.

(57) ABSTRACT

A transistor apparatus includes a silicon substrate and a barrier structure extending substantially from generally adjacent the silicon substrate to a locus displaced from the silicon substrate. The barrier structure generally surrounds a volume containing connection loci for the transistor apparatus and a buried layer in a silicon medium. The connection loci and the buried layer occupy a space generally presenting a first lateral expanse generally parallel with the silicon substrate. The volume presents a second lateral expanse generally parallel with the silicon substrate. The second lateral expanse is greater than the first lateral expanse within a predetermined distance of the substrate.

18 Claims, 1 Drawing Sheet

TRANSISTOR APPARATUS

BACKGROUND OF THE INVENTION

The present invention is directed to transistor apparatuses, and especially to transistor apparatuses configured using silicon on insulator (SOI) technology.

SOI transistors, by way of example and not by way of limitation, may be electrically isolated with respect to adjacent transistor apparatuses and with respect to other circuit components in a device or product by a barrier structure. The barrier structure may be embodied in an oxide-filled (or another electrically isolating agent in place of an oxide) trench substantially surrounding a transistor apparatus. A bottom oxide (BOX) layer may cooperate with the trench to isolate the transistor at its bottom, and a top or cap of oxide may be employed cooperate with the trench to effect electrical isolation at the top of the transistor. Electrical access may be provided through the top or cap in order to establish required electrical connections with the transistor.

A problem with such an electrically isolated transistor is that the transistor apparatus may also be thermally isolated. Such thermal isolation can result in thermally induced offsets that are undesirable and may unpredictably affect operation of the isolated transistor.

There is a need for an electrically isolated transistor apparatus that is constructed to reduce thermal isolation of the apparatus as compared with prior art such transistor apparatuses.

There is also a need for an electrically isolated SOI transistor apparatus that is constructed to reduce thermal isolation of the apparatus as compared with prior art such transistor apparatuses.

SUMMARY OF THE INVENTION

A transistor apparatus includes a silicon substrate and a barrier structure extending substantially from generally adjacent the silicon substrate to a locus displaced from the silicon substrate. The barrier structure generally surrounds a volume containing connection loci for the transistor apparatus and a buried layer in a silicon medium. The connection loci and the buried layer occupy a space generally presenting a first lateral expanse generally parallel with the silicon substrate. The volume presents a second lateral expanse generally parallel with the silicon substrate. The second lateral expanse is greater than the first lateral expanse within a predetermined distance of the substrate.

It is, therefore, an object of the present invention to provide an electrically isolated transistor apparatus that is constructed to reduce thermal isolation of the apparatus as compared with prior art such transistor apparatuses.

It is also an object of the present invention to provide an electrically isolated SOI transistor apparatus that is constructed to reduce thermal isolation of the apparatus as compared with prior art such transistor apparatuses.

Further objects and features of the present invention will be apparent from the following specification and claims when considered in connection with the accompanying drawings, in which like elements are labeled using like reference numerals in the various figures, illustrating the preferred embodiments of the invention.

DETAILED DESCRIPTION OF THE PREFERRED EMBODIMENT

The term "locus" is intended herein to indicate a place, location, locality, locale, point, position, site, spot, volume, juncture, junction or other identifiable location-related zone in one or more dimensions. A locus in a physical apparatus may include, by way of example and not by way of limitation, a corner, intersection, curve, line, area, plane, volume or a portion of any of those features. A locus in an electrical apparatus may include, by way of example and not by way of limitation, a terminal, wire, circuit, circuit trace, circuit board, wiring board, pin, connector, component, collection of components, sub-component or other identifiable location-related area in one or more dimensions. A locus in a flow chart may include, by way of example and not by way of limitation, a juncture, step, site, function, query, response or other aspect, step, increment or an interstice between junctures, steps, sites, functions, queries, responses or other aspects of the flow or method represented by the chart.

Figure 1:
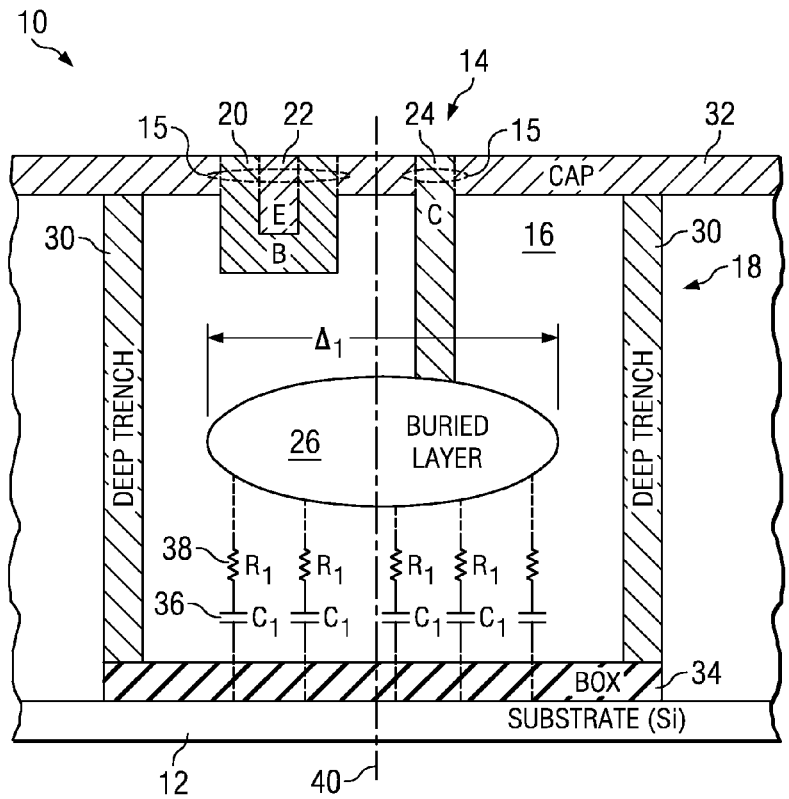
FIG. 1 is a schematic diagram of a transistor apparatus configured according to the prior art.

FIG. 1 is a schematic diagram of a transistor apparatus configured according to the prior art. In FIG. 1, a transistor apparatus 10 includes a substrate 12 and connection loci 14 embedded in a medium 16. Substrate 12 and medium 16 may be embodied in a silicon-based material. Connection loci 14 include a base connector 20, an emitter connector 22 and a collector connector 24. Medium 16 occupies a volume established by a barrier structure 18. Barrier structure 18 includes a trench 30 generally laterally surrounding volume 16, a top or cap member 32 above volume 16 and a bottom member 34 below volume 16. Barrier structure 18 is configured to substantially electrically isolate volume 16 from spaces outside of barrier structure 18. Trench 30 is preferably electrically isolating and may be filled with an oxide material. Cap member 32 is preferably electrically isolating and may be configured using an oxide material. Electrical access to base connector 20, emitter connector 22 and collector connector 24 traversing cap member 32 may be provided, as indicated by traversing dotted lines 15 through cap member 32 in FIG. 1. Bottom member 34 is preferably electrically isolating and may be configured using an oxide material; it is for this reason that bottom member 34 may be referred to as the BOX (Bottom OXide) or the BOX layer. BOX layer 34 is illustrated in substantially abutting relation with substrate 12. Alternatively, BOX layer 34 may be displaced from substrate 12 with other material (usually a silicon medium, such as an epitaxially deposited material) between substrate 12 and BOX layer 34. A buried layer 26 is embedded within volume 16, preferably between connection loci 14 and BOX layer 34. Buried layer 26 is coupled with collector connector 24. Connection loci 24 and buried layer 26 occupy a lateral expanse $\Delta_1$ measured perpendicular with an axis 40. Axis 40 is perpendicular with substrate 12.

Electrically isolating a volume 16 of a transistor apparatus 10 using a barrier structure 18, as illustrated in FIG. 1, also thermally insulates volume 16. Such thermal insulation impedes cooling of transistor apparatus 10 which may be manifested in thermal offsets that may significantly and unpredictably affect operation of transistor apparatus 10. One solution could be to reduce thickness of BOX layer 34. However, such a remedy is not always sufficient, and reduction of thickness of BOX layer 34 reduces electrical isolation of volume 16. Another solution may be to enlarge the area of interface between BOX layer 34 and buried layer 26 by increasing area of volume 16 that is in facing relation with BOX layer 34. Such a configuration reduces thermal resistance by providing greater area for thermal transfer between buried layer 26 and BOX layer 34 for sinking heat with substrate 12. Such an increase in area for thermal transfer from buried layer 26 to BOX layer 34 also increases capacitance between buried layer 26 and substrate 12. This capacitance is embodied in a capacitance 36 having a value on the order of $C_1$ in series with a resistance 38 having a value on the order of $R_1$. A plurality of $R_1$-$C_1$ networks is presented in FIG. 1 to illustrate the reactive impedance coupling between buried layer 26 and substrate 12. This additional reactive impedance between buried layer 26 and substrate 12 can adversely affect speed of operation of transistor apparatus 10.

Figure 2:
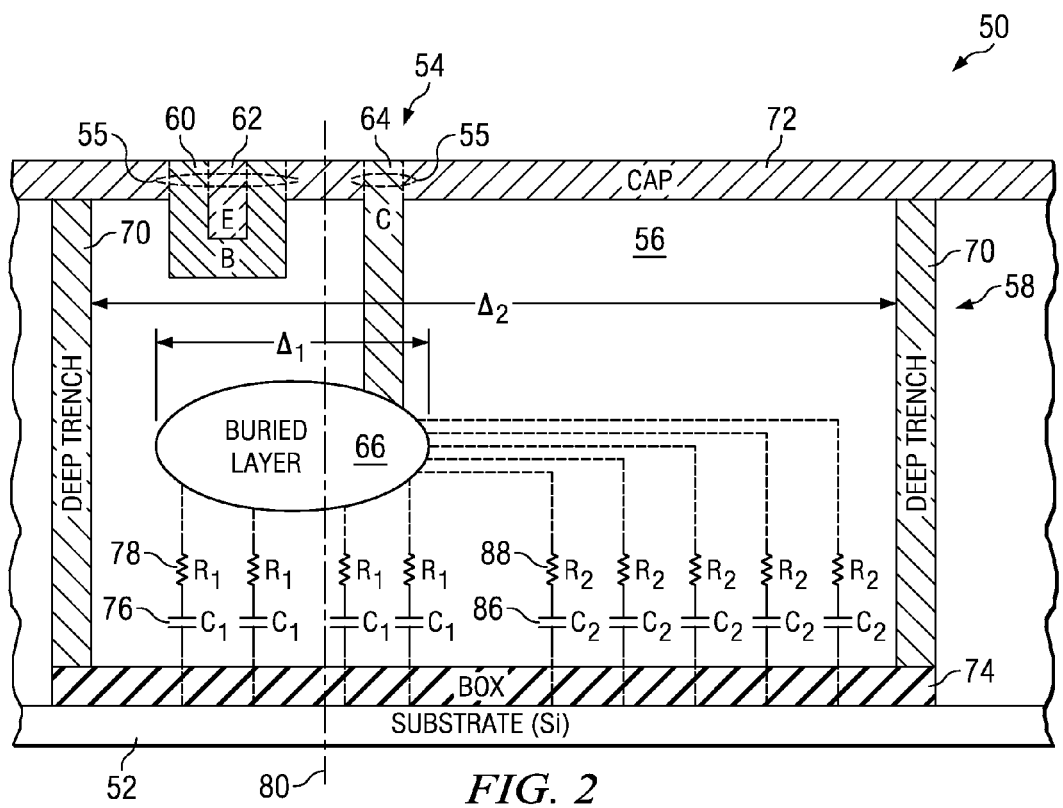
FIG. 2 is a schematic diagram of a transistor apparatus configured according to the teachings of the present invention.

FIG. 2 is a schematic diagram of a transistor apparatus configured according to the teachings of the present invention. In FIG. 2, a transistor apparatus 50 includes a substrate 52 and connection loci 54 embedded in a medium 56. Substrate 52 and medium 56 may be embodied in a silicon-based material. Connection loci 54 include a base connector 60, an emitter connector 62 and a collector connector 64. Medium 56 occupies a volume established by a barrier structure 58. Barrier structure 58 includes a trench 70 generally laterally surrounding volume 56, a top or cap member 72 above volume 56 and a bottom member 74 below volume 56. Barrier structure 58 is configured to substantially electrically isolate volume 56 from spaces outside of barrier structure 58. Trench 70 is preferably electrically isolating and may be filled with an oxide material. Cap member 72 is preferably electrically isolating and may be configured using an oxide material. Electrical access to base connector 60, emitter connector 62 and collector connector 64 is provided traversing cap member 72, as indicated by traversing dotted lines 55 through cap member 72 in FIG. 2. Bottom member 74 is preferably electrically isolating and may be configured using an oxide material; it is for this reason that bottom member 74 is sometimes referred to as the BOX (Bottom OXide) or the BOX layer. BOX layer 74 is illustrated in substantially abutting relation with substrate 52. Alternatively, BOX layer 74 may be displaced from substrate 52 with other material (usually a silicon medium, such as an epitaxially deposited material) between substrate 52 and BOX layer 74. A buried layer 66 is embedded within volume 56 preferably between connection loci 54 and BOX layer 74. Buried layer 66 is coupled with collector connector 64. Connection loci 64 and buried layer 66 occupy a lateral expanse $\Delta_1$ measured perpendicular with an axis 80. Axis 80 is perpendicular with substrate 52.

Electrically isolating a volume 56 of a transistor apparatus 50 using a barrier structure 58, as illustrated in FIG. 2, also thermally insulates volume 56. Such thermal insulation may be manifested in thermal offsets that may significantly and unpredictably affect operation of transistor apparatus 50. As discussed hereinabove in connection with FIG. 1, reducing thickness of BOX layer 74 is not always sufficient to reduce thermal isolation, and reduction of thickness of BOX layer 74 reduces electrical isolation of volume 56. As also discussed hereinabove in connection with FIG. 1, enlarging area of the interface between BOX layer 74 and buried layer 66 by increasing area of volume 56 that is in facing relation with BOX layer 74 increases capacitance between buried layer 66 and substrate 52 which can adversely affect speed of operation of transistor apparatus 50.

The present invention reduces thermal resistance between volume 56 and substrate 52 to enhance thermal dissipation from volume 56. This reduction of thermal resistance is effected with generally little change in capacitive coupling with buried layer 66 (and, hence, with collector 64) so that no significant change to speed of operation of transistor apparatus 50 results. The solution provided by the present invention involves enlarging the trench area—the lateral dimension of volume 56 generally parallel with substrate 52—while keeping buried layer 66 at a minimum lateral expanse necessary to effect desired transistor performance by transistor apparatus 50.

Capacitance between buried layer 66 and substrate 52 is embodied in a capacitance 76 having a value on the order of $C_1$ in series with a resistance 78 having a value on the order of $R_1$. A plurality of series $R_1$-$C_1$ networks is presented in FIG. 2 to illustrate the capacitive coupling between buried layer 66 and substrate 52, as discussed hereinabove in connection with FIG. 1.

It is common for designers to employ a highly doped epitaxially applied material for use as buried layer 66 that is coupled with collector connector 64. The epitaxial doping in other portions of volume 56 may be light enough and thin enough that sheet resistance of such material is on the order of 10 k$\Omega$ (kilo ohms) to 100 k$\Omega$ per square. There is also capacitive coupling between buried layer 66 and substrate 52 in portions of volume 56 that are not located between buried layer 66 and substrate 52. This additional capacitive coupling is embodied in a capacitance 86 having a value on the order of $C_2$ in series with a resistance 88 having a value on the order of $R_2$. A plurality of series $R_2$-$C_2$ networks is presented in FIG. 2 to illustrate the additional capacitive coupling between buried layer 66 and substrate 52 in portions of volume 56 that are not located between buried layer 66 and substrate 52. The series $R_2$-$C_2$ networks, however, have little effect on operation of transistor apparatus 50. This is so because the sheet resistance of material filling volume 56 is sufficiently high to increase impedance of the series $R_2$-$C_2$ networks with respect to impedance of the series $R_1$-$C_1$ networks enough to effectively render contribution by the series $R_2$-$C_2$ networks negligible. By increasing lateral expanse of volume 56 to $\Delta_2$ measured perpendicular with an axis 80 that is perpendicular with substrate 52, and by limiting lateral expanse of transistor elements of transistor apparatus 50 (i.e., connection loci 54 and buried layer 66) to a minimum lateral expanse $\Delta_1$ necessary to effect desired transistor performance by transistor apparatus 50, a predetermined value for thermal resistance between volume 56 and substrate 52 may be achieved within a predetermined distance of substrate 52. Enhanced thermal performance results manifested in enhanced cooling of transistor apparatus 50 without substantially increasing thermal offsets or other thermally-related disadvantages.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims

We claim:

1. A transistor apparatus comprising: a silicon substrate; and a barrier structure extending substantially from generally adjacent said silicon substrate to a locus displaced from said silicon substrate; said barrier structure generally surrounding a volume containing connection loci for the transistor apparatus and a buried layer in a silicon medium; said connection loci and said buried layer occupying a space generally presenting a first lateral expanse generally parallel with said silicon substrate; said volume presenting a second lateral expanse generally parallel with said silicon substrate; said second lateral expanse being significantly enlarged from that needed to enclose said first lateral expanse.

2. A transistor apparatus as recited in claim 1 wherein said silicon medium is an epitaxially established medium.

3. A transistor apparatus as recited in claim 2 wherein said second lateral expanse is sufficiently greater than said first lateral expanse within said predetermined distance of said substrate to establish a predetermined thermal resistance between said volume and said silicon substrate.

4. A transistor apparatus as recited in claim 1 wherein said barrier structure includes a bottom structure, a side structure and a top structure; said side structure comprising at least one trench extending substantially from said bottom structure to said top structure; said at least one trench being filled with an electrically isolating material.

5. A transistor apparatus as recited in claim 4 wherein said bottom structure comprises a bottom layer of electrically isolating material generally in abutting relation with said side structure, and wherein said top structure comprises a top layer of electrically isolating material generally in abutting relation with said side structure.

6. A transistor apparatus as recited in claim 4 wherein said second lateral expanse is sufficiently greater than said first lateral expanse within said predetermined distance of said substrate to establish a predetermined thermal resistance between said volume and said silicon substrate.

7. A transistor apparatus as recited in claim 1 wherein said second lateral expanse is sufficiently greater than said first lateral expanse within said predetermined distance of said substrate to establish a predetermined thermal resistance between said volume and said silicon substrate.

8. A transistor apparatus comprising: a plurality of connection loci and a boundary layer contained generally within a volume of a silicon medium; said volume being displaced from a silicon substrate and within an ambit established by a barrier structure; said buried layer and said plurality of connection loci being generally oriented about an axis extending vertically with respect to said substrate and occupying a space within said volume; said space presenting a first expanse perpendicular with said axis; said volume occupying a second expanse perpendicular with said axis; said second expanse being significantly greater than a minimum required to enclose said first expanse within a predetermined distance of said substrate.

9. A transistor apparatus as recited in claim 8 wherein said barrier structure comprises a layer of electrically isolating material.

10. A transistor apparatus as recited in claim 9 wherein said second expanse is sufficiently greater than said first expanse within said predetermined distance of said substrate to establish a predetermined thermal resistance between said volume and said silicon substrate.

11. A transistor apparatus as recited in claim 8 wherein said at least one second expanse is sufficiently greater than said first expanse within said predetermined distance of said substrate to establish a predetermined thermal resistance between said volume and said silicon substrate.

12. A transistor apparatus configured using silicon-on-insulator technology; the apparatus comprising:
 (a) a silicon substrate;
 (b) a barrier structure surrounding a volume of silicon medium situated a distance from said substrate;
 (c) a plurality of connection loci and a buried layer generally contained within said volume; said plurality of connection loci and said buried layer occupying a space having a first expanse perpendicular with an axis extending vertically from said substrate; said volume occupying a second expanse perpendicular with said axis significantly greater than a minimum required to enclose said first expanse within a predetermined distance of said substrate.

13. A transistor apparatus configured using silicon-on-insulator technology as recited in claim 12 wherein said silicon medium is an epitaxially established medium.

14. A transistor apparatus configured using silicon-on-insulator technology as recited in claim 13 wherein said second lateral expanse is sufficiently greater than said first lateral expanse within said predetermined distance of said substrate to establish a predetermined thermal resistance between said volume and said silicon substrate.

15. A transistor apparatus configured using silicon-on-insulator technology as recited in claim 12 wherein said barrier structure includes a bottom structure, a side structure and a top structure; said side structure comprising at least one trench extending substantially from said bottom structure to said top structure; said at east one trench being filled with an electrically isolating material.

16. A transistor apparatus configured using silicon-on-insulator technology as recited in claim 15 wherein said bottom structure comprises a bottom layer of electrically isolating material generally in abutting relation with said side structure, and wherein said top structure comprises a top layer of electrically isolating material generally in abutting relation with said side structure.

17. A transistor apparatus configured using silicon-on-insulator technology as recited in claim 15 wherein said second lateral expanse is sufficiently greater than said first lateral expanse within said predetermined distance of said substrate to establish a predetermined thermal resistance between said volume and said silicon substrate.

18. A transistor apparatus configured using silicon-on-insulator technology as recited in claim 12 wherein said second lateral expanse is sufficiently greater than said first lateral expanse within said predetermined distance of said substrate to establish a predetermined thermal resistance between said volume and said silicon substrate.

* * * * *